United States Patent [19]

Fattaruso

[11] Patent Number: 4,883,987
[45] Date of Patent: Nov. 28, 1989

[54] COMPARATOR CIRCUIT HAVING A FAST RECOVERY TIME

[75] Inventor: John W. Fattaruso, Dallas County, Tex.

[73] Assignee: Texas Instruments Incorporated, Dallas, Tex.

[21] Appl. No.: 190,207

[22] Filed: May 4, 1988

[51] Int. Cl.[4] .............................................. H03K 5/24
[52] U.S. Cl. ................................... 307/355; 307/491; 307/494; 328/146
[58] Field of Search ............... 307/355, 356, 362, 491, 307/494, 530, 350; 328/146

[56] References Cited

U.S. PATENT DOCUMENTS 4,511,810  4/1985  Yukawa .............................. 307/362

FOREIGN PATENT DOCUMENTS 0145220  8/1983  Japan .................................. 307/494

OTHER PUBLICATIONS

Allstot, "A Precision Variable-Supply CMOS Comparator", IEEE Journal of Solid-State Circuits, vol. SC-17, No. 6, Dec. 1982, pp. 1080-1087.

Primary Examiner—John Zazworsky
Attorney, Agent, or Firm—Stanton Braden; Rodney M. Anderson; Melvin Sharp

[57] ABSTRACT

A multistage comparison circuit (10) having a cascaded chain of capacitively coupled comparators (34) is disclosed. A reset mode of operation (54) imposes a common mode voltage on the input of the comparators (34). Consequently, capacitors (22, 24) which couple the comparators (34) together are charged to compensate for errors so that a high precision comparison may result. A shorting switch (40) couples across differential outputs (36, 38) of the comparators (34) and is momentarily activated prior to each bit comparison (71) in a word comparison mode (70) of operation. This shorting takes the comparators (34) out of saturation and places the comparison circuit (10) in a state which approximates the reset state. Specific comparator architectures are disclosed which force approximately equal currents to be fed into the output nodes (36, 38) and which dynamically adjust output offset voltage and feedthrough errors so that the shorted condition accurately approximates the reset condition.

9 Claims, 3 Drawing Sheets

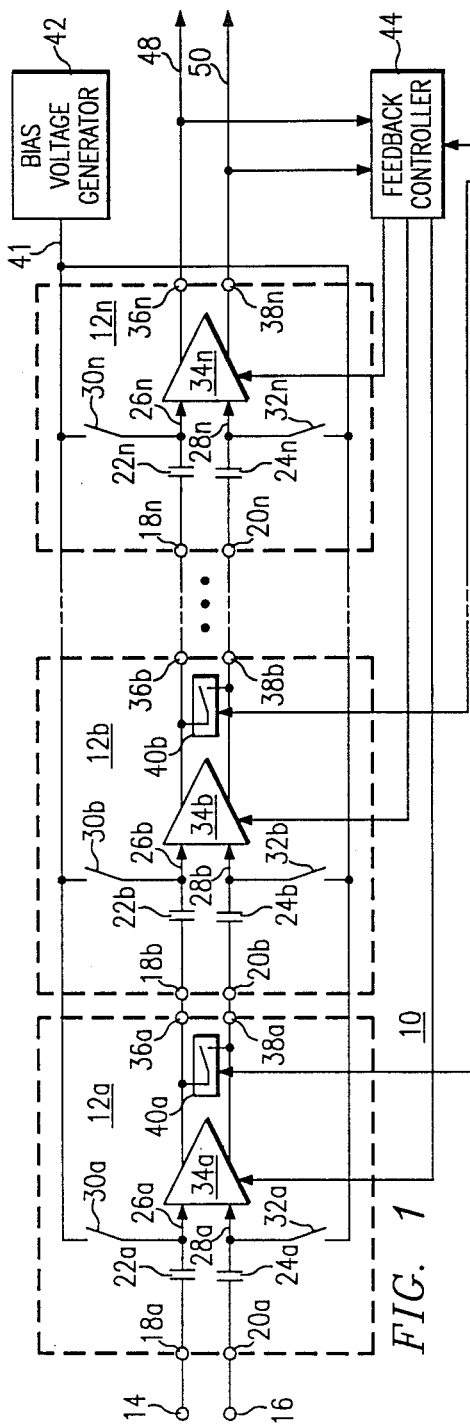
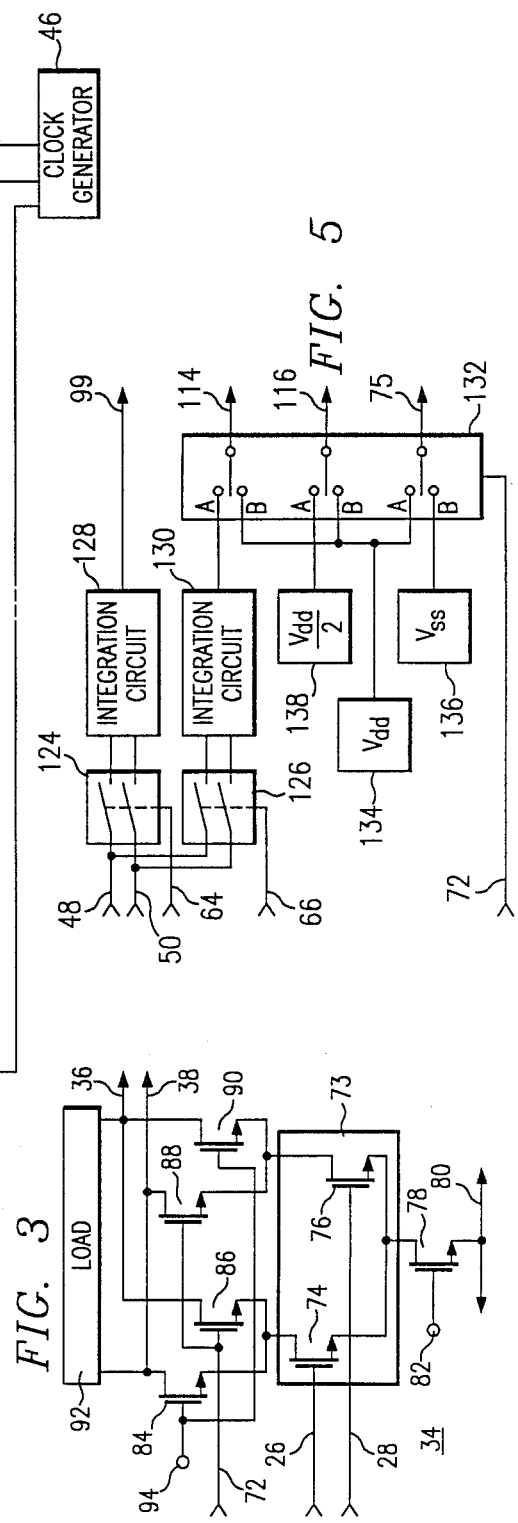

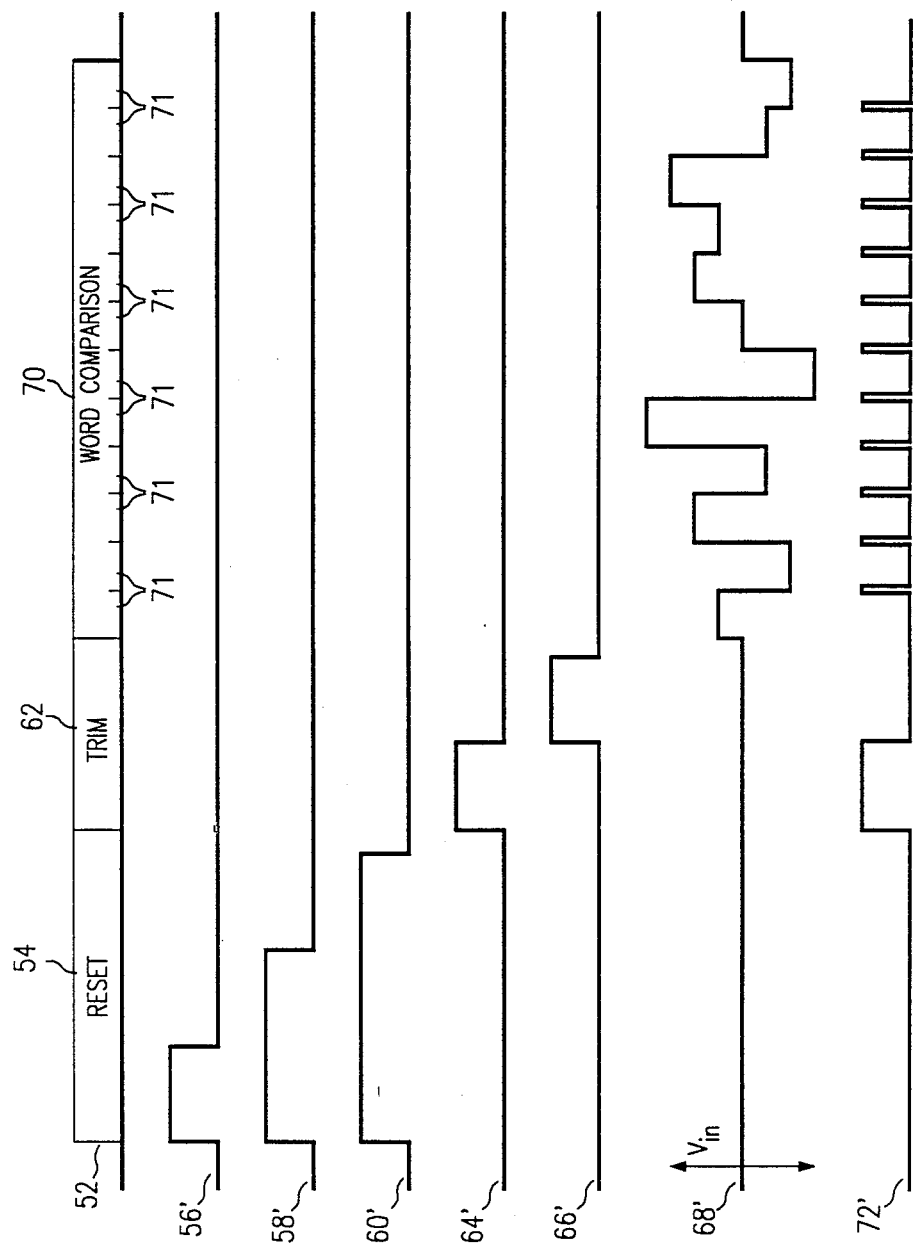

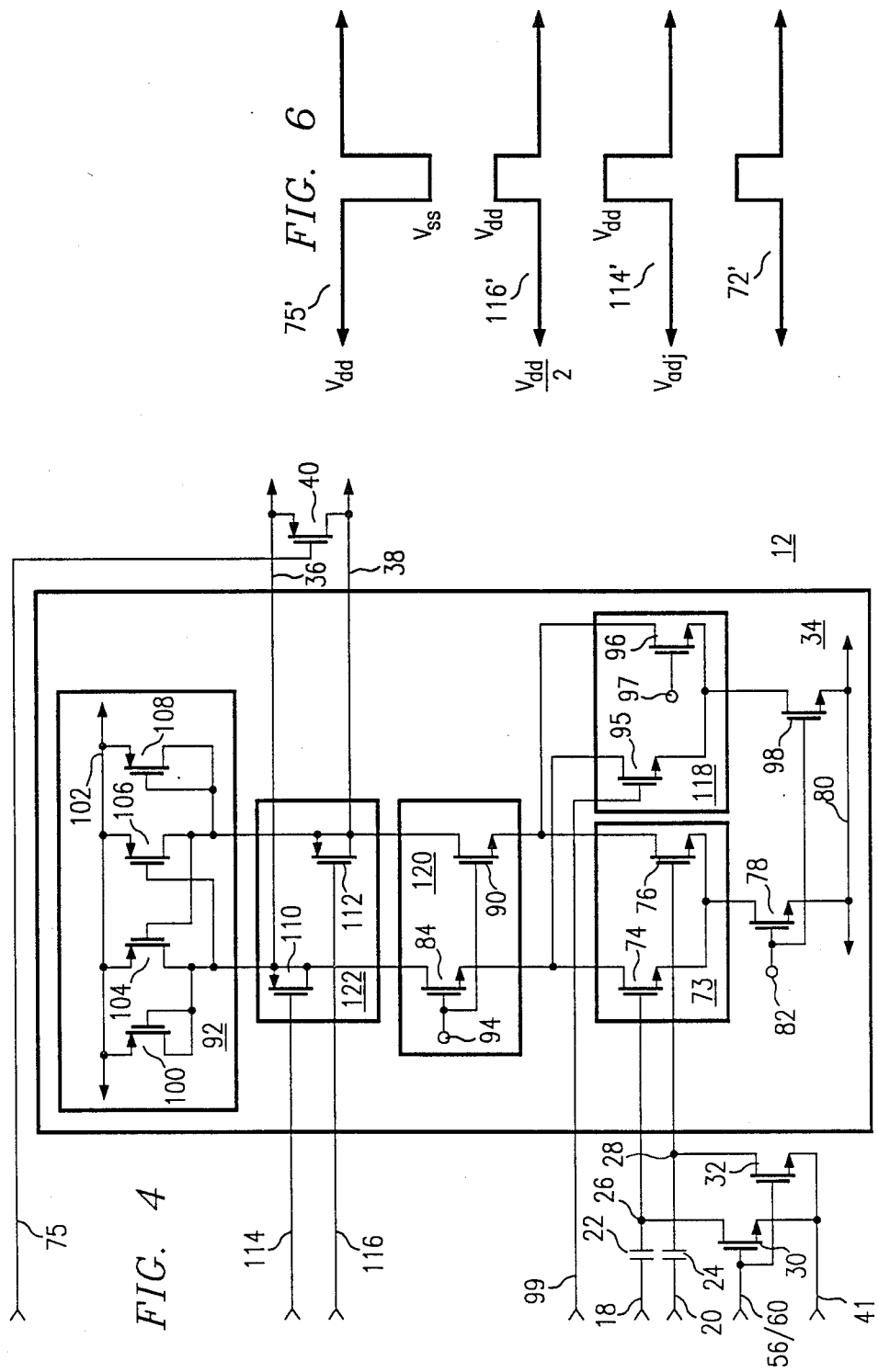

COMPARATOR CIRCUIT HAVING A FAST RECOVERY TIME

TECHNICAL FIELD OF THE INVENTION

The present invention relates generally to electronic comparison circuits. More specifically, the present invention relates to comparison circuits which are useful in constructing successive approximation analog-to-digital circuits or other circuits requiring a plurality of successive, rapid, highly precise comparisons.

BACKGROUND OF THE INVENTION

A comparator is an analog device that compares the amplitude of two analog input voltage or current signals and generates a digital signal indicating whether one of the two analog input signals has a greater amplitude than the other. Although any high gain, differential amplifier may operate as a voltage comparator, precision advantages result from using a plurality of capacitively coupled, series connected, comparator stages. By storing charges that compensate for 1/f noise and a previous stage's output offset voltage on capacitors that couple the stages together, a highly precise comparison results.

However, when overdrive conditions occur, such multistage comparators suffer from an undesirably long recovery time. The recovery time represents the length of time needed to recover from a previous comparison before a subsequent comparison may occur. Successive approximation analog-to-digital (A/D) converters typically include a comparator for making a plurality of successive comparisons. The lengthy recovery time is especially undesirable when a multistage comparator is used in a successive approximation A/D converter application because an overall word conversion must be slowed to account for worst case recovery time on each bit in the conversion. Consequently, a need exists for a comparison circuit that has improved recovery time characteristics.

SUMMARY OF THE INVENTION

It is an advantage of the present invention that a comparison circuit having a fast recovery time is provided so that successive conversions may be performed quickly.

Another advantage of the present invention is that a multistage comparator is provided so that highly precise comparisons may be performed.

Yet another advantage of the present invention is that an output of each stage of a multistage comparator is forced to approximate a reset condition prior to each conversion so that downstream stages may quickly recover from any existing overdrive condition.

The above and other advantages of the present invention are carried out in one form by a comparator and a shorting device. The shorting device couples across outputs of the comparator so that at selective times the comparator outputs are shorted together.

BRIEF DESCRIPTION OF THE DRAWINGS

A more complete understanding of the present invention may be derived by referring to the detailed description and claims when considered in connection with the accompanying drawings, wherein like reference numbers refer to similar items, and:

FIG. 1 shows a block diagram of a multistage comparison circuit constructed according to the teaching of the present invention;

FIG. 2 shows a timing diagram which describes operation of the comparison circuit depicted in FIG. 1;

FIG. 3 shows a schematic diagram of a first embodiment of a comparator portion of the present invention;

FIG. 4 shows a schematic diagram of a single stage which includes a second embodiment of the comparator portion of the present invention;

FIG. 5 shows a block diagram of a feedback controller portion of the present invention; and FIG. 6 shows a timing diagram illustrating signals output from the feedback controller of FIG. 5.

DETAILED DESCRIPTION OF THE PREFERRED EMBODIMENT

FIG. 1 shows a block diagram of a multistage comparison circuit 10 constructed according to the teaching of the present invention. Comparison circuit 10 includes a cascaded chain of comparator stages 12a, 12b, and so on, through 12n. The precise number of stages 12a–12n is not a critical feature in the present invention. Stage 12a represents an ultimate upstream stage, and stage 12n represents an ultimate downstream stage.

In FIG. 1, a differential analog input voltage signal to comparison circuit 10 is received at terminals 14 and 16, which couple to nodes 18a and 20a, respectively. Nodes 18a and 20a serve as the input nodes to stage 12a and couple to first nodes of capacitors 22a and 24a, respectively. Second nodes of capacitors 22a and 24a couple to nodes 26a and 28a and to first ports of switches 30a and 32a, respectively. In addition, nodes 26a and 28a couple to first and second inputs of a voltage comparator 34a. First and second outputs of comparator 34a couple to nodes 36a and 38a, which serve as output terminals from stage 12a of comparison circuit 10. In addition, nodes 36a and 38a couple to first and second ports, respectively, of a switch 40a.

Second ports of switches 30a and 32a couple together and to a node 41, which provides an output from a bias voltage generator 42. A control input of comparator 34a couples to a first output of a feedback controller 44, and a control input of switch 40a couples to a first output of a clock generator 46.

Stage 12b is identical in structure to stage 12a. Thus, nodes 18b and 20b serve as inputs to stage 12b and couple to output terminals 36a and 38a, respectively from stage 12a. Nodes 18b and 20b couple to input nodes 26b and 28b of a voltage comparator 34b through series connected capacitors 22b and 24b, respectively. In addition, nodes 26b and 28b couple to first ports of switches 30b and 32b, respectively. First and second differential outputs of comparator 34b respectively couple to output nodes 36b and 38b and to first and second ports of a shorting switch 40b. Second nodes of switches 30b and 32b couple together and to node 41, which supplies a reference voltage from bias voltage generator 42. Likewise, a control input of comparator 34b couples to a second output of feedback controller 44, and a control input of shorting switch 40b couples to a second output of clock generator 46.

Any number of intervening stages may exist between stage 12b and stage 12n. Thus, output nodes 36b and 38b couple through such intervening stages to input nodes 18n and 20n, respectively, of stage 12n. Stage 12n is structured similarly to stages 12a and 12b, except that a shorting switch has been omitted in stage 12n. Consequently, nodes 18n and 20n couple to input nodes 26n and 28n of a voltage comparator 34n through series connected capacitors 22n and 24n, respectively. In addition, nodes 26n and 28n couple to first ports of switches 30n and 32n, respectively. First and second differential outputs of comparator 34n couple to output nodes 36n and 38n, which serve as the output terminals for stage 12n. Second nodes of switches 30n and 32n couple together and to node 41. Moreover, a control input of comparator 34n couples to a third output of feedback controller 44.

As discussed above, stage 12n represents the ultimate downstream stage of comparison circuit 10. Consequently, output terminals 36n and 38n couple to nodes 48 and 50, respectively, which serve as the output for comparison circuit 10. In addition, nodes 48 and 50 couple to first and second inputs, respectively, of feedback controller 44. A third output of clock generator 46 couples to a third input of feedback controller 44.

Bias voltage generator 42 supplies reference signals which have predetermined amplitudes. The output at node 41 supplies a reference signal. The amplitude of this reference signal is not a critical feature in the present invention but exhibits a voltage somewhere within the common mode range of comparators 34a-34n. Comparators 34a-34n may be either conventional comparators or may incorporate special features as discussed below in connection with FIGS. 3-4. Feedback controller 44 dynamically controls comparators 34a-34n to minimize the recovery time parameter. An individual feedback loop is formed for each of stages 12a12n through feedback controller 44. The operation of feedback controller 44 is discussed below in more detail in connection with FIGS. 5 and 6. Clock generator 46 supplies timing and control signals to feedback controller 44 and to switches 30a-30n, 32a-32n, and 40a-40m. The specific control lines which operate switches 30a-30n and 32a-32n are omitted in FIG. 1 to simplify the drawing.

The timing diagram of FIG. 2 illustrates the operation of comparison circuit 10 in a successive approximation analog-to-digital (A/D) converter application. The timing diagram of FIG. 2 includes a cycle definition 52. Cycle definition 52 shows that comparison circuit 10 (see FIG. 1) operates in three distinct modes during a single conversion by the A/D converter which utilizes comparison circuit 10.

A reset mode 54 occurs first in cycle 52. Signals 56', 58' and 60' illustrate the operation of comparison circuit 10 during reset mode 54. Reset mode 54, as illustrated by the example in FIG. 2, assumes that comparison circuit 10 includes only three of stages 12a-12n. Thus, signal 56' represents a timing signal generated by clock generator 46 (see FIG. 1) which controls the operation of switches 30a and 32a in stage 12a. Likewise, signal 58' represents a signal generated by clock generator 46 which controls the operation of switches 30b and 32b in stage 12b. Moreover, signal 60' is a timing signal generated by clock generator 46 to control the operation of switches 30n and 32n in stage 12n. As shown by signals 56'-60', switches 30a-30n and 32a-32n close simultaneously at the beginning of reset mode 54. Switches 30a-30n and 32a-32n then sequentially open beginning with ultimate upstream stage 12a and ending with ultimate downstream stage 12n. In other words, switches 30a and 32a open first, at the high-to-low transition of signal 56' in FIG. 2. Switches 30b and 32b open next at the high-to-low transition of signal 58' in FIG. 2. Furthermore, switches 30n and 32n open at the high-to-low transition of signal 60' in FIG. 2. If comparison circuit 10 includes additional stages, input switches for such stages are sequenced open in accordance with such stages' position in the chain.

The closing of switches 30a-30n and 32a-32n supplies a common mode signal to inputs 26a-26n and 28a-28n of comparators 34a-34n. In other words, a zero volt differential input is supplied to the signal inputs of each of comparators 34a-34n. Moreover, the closing of switches 30a-30n and 32a-32n presents a low impedance across coupling capacitors 22a-22n and 24a-24n, which causes these coupling capacitors to rapidly charge or discharge. At this point the output signals from each of comparators 34a-34n reflect the output offset voltage parameter of comparators 34a-34n, 1/f errors, feedthrough errors from the operation of switches 30a-30n and 32a-32n, and so on. More precisely, the charge feedthrough from switches 30a-30n and 32a-32n is deposited on coupling capacitors 22a-22n and 24a-24n when the switches open. When switches 30a-30n and 32a-32n are closed, the stage output voltage is the sum of output offset plus 1/f noise errors. Then, when switches 30a-30n and 32a-32n open, feedthrough errors are added to these other errors at the outputs of comparators 34a-34n. Consequently, with a zero volt differential input, and with no corrective action by feedback controller 44, each of comparators 34a-34n outputs a voltage which does not necessarily equal zero volts. Coupling capacitors 22a-22n and 24a-24n therefore charge to voltage levels which compensate for these errors.

The sequence used in opening switches 30a-30n and 32a-32n compensates for feedthrough errors due to the operation of switches 30a-30b and 32a-32b. However, errors attributable to stage 12n are not compensated. Nevertheless, a lack of compensation for errors in stage 12n does not significantly affect the precision obtainable by comparison circuit 10 because this error has an influence only to the extent that it is divided by the gain of all further upstream stages. Consequently, the storing of compensation charges in coupling capacitors 22a-22n and 24a-24n allows comparison circuit 10 to achieve micro-volt precision levels.

At the end of reset mode 54, all of switches 30a-30n and 32a-32n are open, and capacitors 22a-22n and 24a-24n do not significantly charge or discharge throughout the remainder of cycle 52.

After reset mode 54, a trim mode 62 occurs. As a result of reset mode 54, the output signals generated by each of comparators 34a-34n exhibit nearly zero voltage level. However, these voltage levels need not precisely equal zero volts. Feedback controller 44 (see FIG. 1) forces these output signals to average around zero volts during trim mode 62. Moreover, trim mode 62 may be subdivided into an offset trim portion as indicated by signal 64' in FIG. 2, and a feedthrough error adjustment portion as indicated by signal 66'. The operation of trim mode 62 is discussed below in more detail in connection with FIGS. 5 and 6.

The differential input voltage signal to comparison circuit 10 at terminals 14 and 16 (see FIG. 1) is illustrated by signal 68' in FIG. 2. Throughout reset mode 54 and trim mode 62, signal 68' is held to a zero volt level by circuits which are not shown in the Figures. However, after trim mode 62, input signal 68' begins to exhibit a variety of both positive and negative levels in a conventional fashion for A/D converters as a word comparison mode 70 commences. Word comparison mode 70 is partitioned into a plurality of bit comparison periods 71. Cycle definition 52 shows word comparison mode 70 as containing 12 bit comparison periods 71. The twelve periods 71 produce a 12 bit A/D conversion. However, any number of bit comparisons may be made during a word comparison mode 70. Input signal 68' changes after each of bit comparison periods 71 in word comparison mode 70.

Immediately, after reset mode 54 and trim mode 62, no portion of comparison circuit 10 is in saturation. Thus, comparison circuit 10 may respond quickly to signal 68'. However, after responding to signal 68', one or more of stages 12a–12n may be in saturation. Without again resetting comparator circuit 10, comparator circuit 10 must experience a recovery time before its output may again respond to a change in input signal 68'. In other words, the additional period of time required for comparison circuit 10 to respond to an input signal from a saturated state rather than from the reset state represents the recovery time.

Clock generator circuit 46 (see FIG. 1) generates a separate shorting signal 72' for each of stages 12a, 12b, and so on. Shorting signal 72' causes switches 40a, 40b, and so on to momentarily short the differential outputs for each of comparators 34a, 34b, and so on, respectively, together at the beginning of each bit comparison period 71. Of course, those skilled in the art will understand that the shorting of outputs together still permits switches 40a–40m to have a finite resistance characteristic of switches and of active devices in an on condition. An additional shorting signal pulse may be asserted during offset trim period 64' for a trimming operation which is discussed below in connection with FIGS. 5 and 6. The shorting of differential outputs together momentarily forces comparators 34a–34n to approximate the reset condition. Thus, immediately after assertion of shorting signal 72', each of comparators 34a–34n may respond more quickly to input signals than would occur if comparators 34a–34n were allowed to remain in saturation. This shorting does not significantly decrease the impedance across capacitors 22a–22n and 24a–24n (see FIG. 1). Thus, the stored charge on capacitors 22a–22n and 24a–24n does not significantly change as a result of the activation of signal 72'.

Each of the signals shown in FIG. 2 may be easily generated in clock generator 46 by those skilled in the art. In the preferred embodiment, shorting signal 72' becomes active for only a few nanoseconds at a time during word comparison time 70. Such a signal may be produced using propagation delays in a manner known to those skilled in the art.

Even when shorting signal 72' is activated, some residual differential output voltage at each of comparators 34a–34n remains. This residual voltage is caused by the finite resistance through closed switches 40a and 40b, nonbalanced voltages at differential inputs of comparators 34a–34n, device mismatches within comparators 34a–34n, and so on. In very high precision comparisons, this residual differential output voltage at upstream ones of stages 12a–12n may ripple through comparison circuit 10 so that downstream ones of stages 12a–12n remain in saturation in spite of the differential output shorting provided by switches 40a–40b. In applications where such residual differential output voltages may cause saturation, a specific architecture for comparators 34a–34n may be used to lessen the residual voltage.

FIG. 3 shows one example of such a comparator. The FIG. 3 comparator is referenced without the alphabetic descriptors used in FIG. 1 to indicate that the comparator 34 of FIG. 3 may serve as any of comparators 34a–34n. Thus, input nodes 26 and 28 of comparator 34 couple to control inputs of active devices which couple together to form a differential pair 73. Specifically, node 26 couples to a gate of a an N-channel FET 74, and node 28 couples to a gate of an N-channel FET 76. Sources of FETs 74 and 76 couple together and to a drain of an N-channel FET 78. A source of FET 78 couples to a terminal 80 which supplies a predetermined voltage, such as $V_{ss}$. A gate of FET 78 couples to a terminal 82 which provides a bias voltage that causes FET 78 to act as a constant current "tail" source for differential pair 73.

A drain of FET 74 represents one output of differential pair 73. The drain of FET 74 couples to sources of N-channel FETs 84 and 86. Likewise, a drain of FET 76 represents a second output of differential pair 73 and couples to sources of N-channel FETs 88 and 90. Drains of FETs 84 and 88 couple together, to output node 38, and to a first port of a load 92. Drains of FETs 86 and 90 couple together, to node 36, and to a second port of load 92. Gates of FETs 84 and 90 couple together and to a terminal 94 which supplies a bias voltage that causes FETs 84 and 90 to remain "on" at all times. Gates of FETs B6 and 88 couple together and to a terminal 72, which receives a signal similar to shorting signal 72', discussed above in connection with FIG. 2.

The signal supplied to node 72 is "off", or low, at all times except when shorting signal 72' becomes active. When signal 72' is off, FETs 86 and 88 do not conduct current, and FETs 84 and 90 together operate as a cascode stage which improves gain and response time over a differential amplifier which does not include such a cascode stage. However, during the activation of shorting signal 72', a voltage level is supplied at terminal 72 which approximately equals the bias voltage applied at terminal 94. Since these two voltages are approximately equal, the current flowing into node 36 substantially equals the current flowing into node 38. This occurs regardless of a particular differential input voltage applied at nodes 26 and 28. Consequently, when shorting switches 40a–40b (see FIG. 1) close, little current flows through switches 40a–40b, and the outputs at nodes 36 and 38 for each of stages 12a–12n more closely equals a zero volt level. Comparators 34a–34n are less likely to remain in saturation, and recovery time for comparison circuit 10 improves.

As discussed above, the reset state need not cause comparators 34a–34n to output precisely zero volt signals. Thus, even if shorting switches 40a–40b (see FIG. 1) are entirely successful in forcing outputs from comparators 34a–34b to equal a zero volt differential output, such an output does not exactly represent the reset state. The output voltage difference between this "zero" state and the reset state may be sufficient to cause downstream stages to saturate at the instant when shorting switches 40a–40b are opened and charges stored on capacitors 22a–22n and 24a–24n are added to zero volt output signals. Consequently, recovery from the zero state to the reset state slows recovery time when compared to a recovery time that would result if the zero state and the reset state were nearly matched. In applications where even this recovery time presents a problem, each stage may be trimmed so that the reset state tends to match the zero state. In other words, each stage may be trimmed so that the output voltage from each stage on average at the end of reset mode 54 (see FIG. 2) equals zero volts.

FIG. 4 shows a schematic diagram of an entire stage 12 of comparison circuit 10. The stage shown in FIG. 4 represents any one of stages 12a–12n (see FIG. 1) and is therefore referenced without using alphabetic descriptors. Stage input nodes 18 and 20 respectively couple to first nodes of capacitors 22 and 24. Second nodes of capacitors 22 and 24 couple to input nodes 26 and 28, respectively, of comparator 34 and to drains of N-channel FETs 30 and 32, respectively. Gates of FETs 30 and 32 couple together and to a terminal 56/60. Sources of FETs 30 and 32 couple to terminal 41.

Input nodes 26 and 28 of comparator 34 couple to gates of N-channel FETs 74 and 76. Sources of FETs 74 and 76 couple together and to a drain of N-channel FET 78. A source of FET 78 couples to node 80, which supplies a predetermined voltage, such as $V_{ss}$. A gate of FET 78 couples to node 82, which supplies a bias voltage sufficient to cause FET 78 to operate as a constant current source. The drain of FET 74 couples to a source of N-channel FET 84 and to a drain of an N-channel FET 95. Likewise, a drain of FET 76 couples to a source of N-channel FET 90 and to a drain of an N-channel FET 96. A source of FET 95 couples to a source of FET 96 and to a drain of an N-channel FET 9B. A gate of FET 96 couples to a terminal 97, and a gate of FET 95 couples to a terminal 99. A source of FET 98 couples to node 80, and a gate of FET 98 couples to node 82.

Gates of FETs 84 and 90 couple together and to a node 94 which supplies a bias voltage sufficient to maintain FETs 84 and 90 in an on condition. Drains of FETs 84 and 90 couple to output nodes 36 and 38, respectively. Likewise, the first and second ports of load 92 couple to nodes 36 and 38, respectively. Load 92 includes a P-channel FET 100, which has a source thereof coupled to a terminal 102 that supplies a constant potential, such as $V_{dd}$. Load 92 additionally includes a P-channel FET 104, which has a source that couples to node 102. A drain of FET 104, a drain of FET 100, and a gate of FET 100 couple to node 36. Load 92 additionally includes a P-channel FET 106 and a P-channel FET 108. Sources of FETs 106 and 108 couple to node 102. Drains of FETs 106 and 108, and a gate of FET 106 couple together and to node 38. In addition, a gate of FET 104 couples to node 38, and a gate of FET 108 couples to node 36.

Moreover, a P-channel FET 110, which is configured as a capacitor, couples to node 36, and a P-channel FET 112, which is configured as a capacitor, couples to node 38. Specifically, a drain and a source of FET 110 couple together and to node 36. A gate of FET 110 couples to a terminal 114. A drain and a source of FET 112 couple together and to node 38. A gate of FET 112 couples to a terminal 116. Output nodes 36 and 38 represent the outputs both from comparator 34 and from stage 12. Shorting switch 40 couples between nodes 36 and 38. In FIG. 4, a P-channel FET 40 provides the shorting switch function. A source of FET 40 couples to terminal 36 and a drain of FET 40 couples to node 38. A gate of FET 40 couples to a terminal 75.

As discussed above in connection with FIG. 3, FETs 74 and 76 couple together to form differential pair 73. Likewise, FET 78 serves as a constant current "tail" source for differential pair 73. Moreover, FETS 95 and 97 couple together to form a second differential pair 118 and FET 98 serves as a constant current "tail" source for differential pair 118. As discussed above in connection with FIG. 3, FETS 84 and 90 couple to differential pair 73 to form a cascode stage 120. FETs 110 and 112 together form a feedthrough charge compensating circuit 122, for inserting charges to compensate for feedthrough errors at nodes 36 and 38. FETs 78 and 98, differential pairs 73 and 118, cascode stage 120, circuit 122, and load 92 together form comparator 34 in this embodiment of the present invention.

Capacitors 22 and 24, switches 30 and 32, and switch 40 operate substantially as described above in connection with FIG. 1. Specifically, a signal, such as one of signals 56′–60′ shown in FIG. 2, activates FETs 30 and 32 to supply the reference signal from bias voltage generator 42 (see FIG. 1) at node 41 to inputs 26 and 28 of comparator 34. At the same time, this causes capacitors 22 and 24 to charge or discharge and compensate for errors in preceding stages of comparison circuit 10. A signal having the timing characteristics of signal 72′ shown in FIG. 2 is received at terminal 75 to cause FET 40 to momentarily short output terminals 36 and 38 together, as discussed above in connection with FIGS. 1–2. In comparator 34, the specific structure of load 92 provides positive feedback which improves the gain and response time of comparator 34 over the gain and response achieved without such positive feedback.

Differential pair 118 and tail current source 98 are smaller and conduct less current than is conducted by differential pair 73 and tail current source 78. Differential pair 118 connects to differential pair 73 so that a small portion of the current flowing in nodes 36 and 38 flows through differential pair 118. Trim voltages are applied at terminal 99 and 97 to steer small amounts of current from nodes 36 and 38 through FETs 95 and 96, respectively. Consequently, the relative amplitude of these trim voltages adjust the output offset voltage for comparator 34. For example, by increasing the trim voltage applied at terminal 99 above that applied at terminal 97, slightly more current flows through FET 95 and node 36 than flows through FET 96 and node 38. This causes the voltage at terminal 36 to decrease compared to the voltage at node 38. The preferred embodiment establishes the trim voltage applied at terminal 97 as a constant bias voltage and adjusts the voltage applied at terminal 99 in a negative feedback loop, as discussed below in connection with FIGS. 5 and 6.

Whenever shorting switch 40 activates or deactivates, a small feedthrough charge is applied at nodes 36 and 38. This feedthrough charge causes errors which may propagate through comparison circuit 10 (see FIG. 1). Thus, circuit 122 is configured to compensate for these feedthrough charges. FETS 110, 112, and 40 are constructed to be substantially similar types of active devices. The signal supplied at terminals 114 and 116 have the same timing as the signal applied at terminal 75. However, the signals supplied at terminals 114 and 116 exhibit an opposite polarity to the signal applied at terminal 75. Thus, a rising edge signal appearing on terminal 75 is compensated by a following edge signal applied at terminals 114 and 116. Moreover, the voltage levels applied at terminals 114 and 116 are adjusted to maximize the ability of circuit 122 to compensate for the feedthrough error produced at switch 40.

FIG. 5 shows a block diagram of a feedback controller 44 (see FIG. 1) which operates in connection with the schematic diagram shown in FIG. 4. In the preferred embodiment, the circuit shown in FIG. 5 is duplicated for each of stages 12a–12n in comparison circuit 10 (see FIG. 1). In FIG. 5 output node 48 from comparison circuit 10 (see FIG. 1) couples to first input ports of switches 124 and 126. Likewise, output node 50 from comparison circuit 10 couples to second input ports of switches 124 and 126. First output ports of switches 124 and 126 couple to first inputs of integration circuits 128 and 130, respectively, and second output ports of switches 124 and 126 couple to second inputs of integration circuits 128 and 130, respectively. A control input of switch 124 couples to a terminal 64, and a control input of switch 126 couples to a terminal 66. An output of integration circuit 128 couples to terminal 99.

An output of integration circuit 130 couples to a first "A" input port of a switch 132. A bias voltage generator 134, which supplies a predetermined reference voltage, such as $V_{dd}$, couples to first and second "B" input ports of switch 132 and to a third "A" input port of switch 132. A bias voltage generator 136, which supplies a reference voltage, such as $V_{ss}$, couples to a third "B" input port of switch 132, and a bias voltage generator 138, which supplies a reference voltage between $V_{ss}$ and $V_{dd}$, such as $V_{dd}/2$ couples to a second "A" input port of switch 132. First, second, and third output ports of switch 132 couple to terminas 114, 116, and 75, respectively. A control input of switch 132 couples to terminal 72.

Switch 124 and integration circuit 128 operate together to dynamically adjust the trim voltage supplied at terminal 99, shown in FIG. 4. Switch 124 closes during the activation of a signal supplied at terminal 64. FIG. 2 shows a signal 64' which is supplied at terminal 64 during the trim adjustment period of trim mode 62. Thus, during the trim adjustment period of trim mode 62, integration circuit 128 integrates the output from comparison circuit 10 to obtain a value which is then fed back to terminal 99 of a particular one of comparators 34a–34n. The time constant of integrator 128 is very slow compared to the clock cycle so that the voltage developed at the outputs of integrator 128 accumulates over many trim cycles. In the preferred embodiment it may take as many as 1000 trim cycles for equilibrium to be reached. However, this extended period of time causes no difficulty because thermal drift, which this feedback loop must follow, is very slow. The results of this integration is a signal which tends to adjust the output offset voltage of the particular one of comparators 34a–34n to reduce the signal output from comparison circuit 10 during trim mode 62. During successive conversion cycles 52 (see FIG. 2), different ones of comparators 34a–34n may be trimmed using a unique switch 124 and integration circuit 128 for that particular one of comparators 34a–34n. Thus, if comparison circuit 10 contains only three of stages 12a–12n, then the trim voltage supplied by integration circuit 128 is updated every third conversion cycle. The repetitive updates permit the trim adjustment to maintain temperature independence.

Switch 126 and integration circuit 130 operate together in a manner similar to that described above for switch 124 and switch 128. However, switch 126 is activated during the feedthrough adjustment period 66', discussed above in connection with FIG. 2. Consequently, the signal output from integration circuit 130 increases or decreases in accordance with whether a voltage level supplied to terminal 114 should be increased or decreased to properly compensate for feedthrough errors produced by the operation of switch 40 during trim mode 62 (see FIG. 4).

FIG. 6 shows a timing diagram that illustrates the operation of switch 132. The signal 72', discussed above in connection with FIG. 2, is applied at terminal 72 to control the operation of switch 132, as shown in signal 72' of FIG. 6. Switch 132 is configured to operate as a multiplexer which selects either the "A" inputs or "B" inputs for application at the outputs thereof. Thus, when signal 72' becomes active, switch 132 selects signals supplied at the "B" inputs for application at terminals 114, 116 and 75. Specifically, when signal 72' becomes active, terminal 75 supplies a signal 75' shown in FIG. 6, which exhibits a $V_{ss}$ voltage level. Likewise, terminal 116 supplies a signal 116' which exhibits a $V_{dd}$ voltage level during this period, and terminal 114 supplies a signal 114' which exhibits a $V_{dd}$ voltage level during this period. When signal 72' deactivates, switch 132 selects signals supplied at the "A" inputs for application to terminals 75, 116, and 114. Thus, during this period signal 75' exhibits a $V_{dd}$ level, signal 116' exhibits a $V_{dd}/2$ level, and signal 114' exhibits the adjustable level supplied by integration circuit 130.

As shown in FIG. 2, signal 72' becomes active during offset trim period 64'. In other words, signal 72' in FIG. 2 illustrates a stage 12a–12n which is being trimmed. Signal 72' is asserted only during word comparison time 70 (see FIG. 2) for stages 12a–12n which are not experiencing a trim cycle. Consequently, switch 126 and integration circuit 130 integrate the results at the output of comparison circuit 10 from this switching of switch 40 at the particular one of stages 12a–12n being trimmed. Only one of stages 12a–12n is updated during a single conversion cycle 52. Thus, a circuit shown in FIG. 5 is duplicated for each stage in comparison circuit 10.

In summary, the present invention provides a voltage comparison circuit which has a fast recovery time Due to the fast recovery time, a plurality of successive conversions may be performed quickly. Moreover, the present invention provides a multistage comparator so that highly precise comparisons result. Still further, the use of switch 40 forces the outputs from each of stages 12a–12n to approximate a reset condition so that downstream ones of stages 12a–12n may quickly recover from an overdrive condition. The use of current equalization circuits, such as shown in FIG. 3, or adjustment circuits such as shown in FIGS. 4–5, allow a "zero" condition to more closely approximate the "reset" condition so that recovery time is reduced accordingly.

The foregoing description uses preferred embodiments to describe the present invention. However, those skilled in the art will recognize that changes and modifications may occur in these embodiments without departing from the scope of the present invention. For example, although the preferred embodiment of the present invention utilizes FET devices, those skilled in the art will recognize that the inventive concepts discussed herein may be applied to any type of active device whether it be a MOS FET, CMOS FET, bipolar transistor, or the like. Still further, the above discussion has presented particular polarities in connection with active devices and signal levels. Those skilled in the art will recognize the various polarities may be reversed without departing from the teaching of the present invention. Moreover, the differential signals discussed above include single-ended signals with a ground reference. Still further, the preferred embodiment of the present invention is discussed above in connection with a successive approximation A/D converter. However, those skilled in the art will recognize that the present invention represents a comparator which may be used in applications other than those dealing with A/D converters. These and other changes and modifications to the preferred embodiments of the present invention are intended to be included within the scope of the present invention.

What is claimed is:

1. A comparator circuit having a short recovery time, said circuit comprising:
    a first comarator having a first input for receipt of a first analog signal, a second input for receipt of a second analog signal, and first and second outputs which together indicate whether said first analog signal exhibits a greater amplitude than said second analog signal;
    first means, having a first port coupled to said first output and a second port coupled to said second output, for selectively shorting said first and second outputs together;
    a second comparator having first and second inputs and first and second outputs;
    a first capacitor coupled in series between said comparator first output and said second comparator first input;
    a second capacitor coupled in series between said comparator second output and said second comparator second input;
    and second means, having a first port coupled to said second comparator first output and a second port coupled to said second comparator second output, for shorting said first and second outputs of said second comparator together so as to preserve the charge on each of the first and second capacitors.

2. A comparison circuit as claimed in claim 1 additionally comprising:
    means for supplying a reference signal;
    first and second switching means for selectively coupling said reference signal to said first and second inputs, respectively, of said comparator; and
    third and fourth switching means for selectively coupling said reference signal to said first and second inputs, respectively, of said second comparator.

3. A comparison circuit comprising:
    a first comparator having first and second inputs and first and second outputs;
    a first shorting device, having a first port coupled to said first comparator first output and a second port coupled to said first comparator second output, said first shorting device being for selectively shorting said first and second outputs of said first comparator together;
    a second comparator having first and second inputs and first and second outputs;
    a first capacitor coupled in series between said first comparator first output and said second comparator first input;
    a second capacitor coupled in series between said first comparator second output and said second comparator second input;
    a second shorting device, having a first port coupled to said second comparator first output and a second port coupled to said second comparator second output, said second shorting device being for shorting said first and second outputs of said second comparator together;
    a first adjusting circuit, coupled to said first comparator, said first adjusting circuit being for dynamically adjusting an output offset voltage parameter of said first comparator to be approximately zero volts;
    a second adjusting circuit coupled to said second comparator, said second adjusting circuit being for dynamically adjusting the output offset voltage parameter of said second comparator to be approximately zero volts;
    a first charge inserting circuit coupled to said first comparator, said first charge inserting circuit being for inserting a first feedthrough charge at each of said first comparator first and second outputs wherein said first feedthrough charges compensate for signal feedthrough errors caused by said first shorting device; and
    a second charge inserting circuit coupled to said second comparator, said second charge inserting circuit being for inserting a second feedthrough charge at each of said second comparator first and second outputs wherein said second feedthrough charges compensate for signal feedthrough errors caused by said second shorting device.

4. A method of compairing amplitudes of two analog signals in a multistage comparator, said method comprising the steps of:
    resetting said comparator by storing charges which compensate for errors output from upstream stages of said comparator on capacitors which are coupled in series between said stages;
    performing a plurality of compairson operations after said resetting step; and
    shorting a first output from at least one of said stages to a second output from said at least one of said stages between each of said comparisons.

5. A method as claimed in claim 4 additionally comprising the step of equalizing current flowing at each of said first and second outputs of said at least one of said stages during said shorting step so that said at least one of said stages outputs substantially zero volts during said shorting step.

6. A method as claimed in claim 4 additionally comprising the step of dynamically adjusting output offset voltage of said at least one of said stages to be approximately zero volts.

7. A method as claimed in claim 6 comprising the step of feeding a signal generating by an ultimate downstream one of said stages back to said at least one of said stages to adjust said output offset voltage in a negative feedback loop.

8. A method as claimed in claim 4 additionally comprising the step of inserting a feedthrough charge at each of said first and second outputs of said at least one of said stages so that said feedthrough charges compensate for feedthrough errors produced during said shorting step.

9. A method as claimed in claim 8 additionally comprising the step of feeding a signal generated by an ultimate downstream one of said stages back to said at least one of said stages to adjust the amount of inserted charge in a negative feedback loop.

* * * * *